United States Patent
Furukawa et al.

(10) Patent No.: US 6,429,045 B1
(45) Date of Patent: Aug. 6, 2002

(54) STRUCTURE AND PROCESS FOR MULTI-CHIP CHIP ATTACH WITH REDUCED RISK OF ELECTROSTATIC DISCHARGE DAMAGE

(75) Inventors: Toshiharu Furukawa, Essex Junction; Mark C. Hakey, Fairfax; Steven J. Holmes, Milton; David V. Horak, Essex Junction, all of VT (US); H. Bernhard Pogge, Hopewell Junction, NY (US); Edmund J. Sprogis, Underhill; Steven H. Voldman, South Burlington, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/779,215

(22) Filed: Feb. 7, 2001

(51) Int. Cl.$^7$ .......................... H01L 21/44; H01L 21/48; H01L 21/50; H01L 21/4763; H01L 23/552

(52) U.S. Cl. ...................... 438/107; 438/125; 438/618; 438/928; 257/660

(58) Field of Search ................................. 438/107, 125, 438/618, 928; 257/660

(56) References Cited

U.S. PATENT DOCUMENTS

| | | |
|---|---|---|
| 4,535,219 A | 8/1985 | Sliwa, Jr. |
| 5,075,253 A | 12/1991 | Sliwa, Jr. |
| 5,478,778 A | 12/1995 | Tanisawa |
| 5,506,383 A | 4/1996 | Chen |
| 5,729,038 A | 3/1998 | Young et al. |
| 5,731,223 A * | 3/1998 | Padmanabhan |
| 5,891,761 A | 4/1999 | Vindasius et al. |
| 5,907,785 A | 5/1999 | Palagonia |
| 5,930,098 A | 7/1999 | Voldman et al. |
| 5,940,679 A | 8/1999 | Tomura et al. |
| 5,953,588 A | 9/1999 | Camien et al. |
| 5,970,321 A | 10/1999 | Hively |
| 5,972,735 A | 10/1999 | Dominic |
| 6,015,722 A | 1/2000 | Banks et al. |
| 6,025,262 A | 2/2000 | Tuttle et al. |
| 6,025,638 A | 2/2000 | Pogge et al. |
| 6,306,680 B1 * | 10/2001 | Fillon et al. ................. 438/106 |

* cited by examiner

*Primary Examiner*—Tuan H. Nguyen
*Assistant Examiner*—Nema Berezny
(74) *Attorney, Agent, or Firm*—Ratner & Prestia; Lawrence R. Fraley, Esq.

(57) ABSTRACT

A technique for fabricating precision aligned macros (PAMs) with reduced risk of electrostatic discharge damage and thermal damage. An electrical and thermal contact is provided through the back of the individual chips to a supporting silicon substrate. A conductive seed layer for electroplating is formed on a support substrate. A dielectric (preferably, a thermid) layer is formed on the seed layer. Vias are formed in the thermid layer and metal contacts are formed in the vias. The front faces of two or more chips are bonded onto the top surface of an alignment substrate, and the chips are aligned to the alignment substrate. The back faces of the chips are bonded to the metal contacts and thermid layer with heat and pressure. The alignment substrate is removed. The front faces of the chips are planarized. Finally, interconnect wiring is formed over the chips and thermid layer.

15 Claims, 4 Drawing Sheets

STRUCTURE AND PROCESS FOR MULTI-CHIP CHIP ATTACH WITH REDUCED RISK OF ELECTROSTATIC DISCHARGE DAMAGE

TECHNICAL FIELD

The present invention relates generally to the fabrication of semiconductor devices and more particularly to chip attachment for precision aligned macro (PAM) applications.

BACKGROUND OF INVENTION

A "chip" is a semiconductor body in which an integrated circuit is formed or is to be formed; often, the word "chip" and the term "integrated circuit" are used interchangeably. The fabrication of precision aligned macros (PAMs) involves joining a series of previously diced chips into a precision-aligned planer array on a common substrate, and wiring these diced chips together. PAMs can be used to provide a wide variety of devices with incompatible fabrication processes on a single chip. Existing PAM fabrication techniques suffer from a susceptibility, however, to electrostatic discharge damage and thermal damage.

One approach to making planer arrays of diced chips (or segments) is disclosed by H. Bernard Pogge et al. in U.S. Pat. No. 6,025,638. The approach uses a removable mandrel (alignment wafer) to align the diced chips, fills the gaps between chips with a dielectric material, planarizes the back end of the diced chips using chemical mechanical polishing, and bonds a carrier wafer to the planer back ends of the diced chips. Pogge et al. do not provide a process for reducing the risk of electrostatic discharge damage or thermal damage during interconnect wiring of the diced chips. Moreover, although the process taught by Pogge et al. can planarize diced chips with thickness variations due to process variability, chemical mechanical polishing can damage diced chips which are substantially thicker than surrounding diced chips by design.

Another approach to making planer multi-chip modules is disclosed by Yaw-Hwang Chen in U.S. Pat. No. 5,506,383. Chen forms a multi-chip module by placing chips into openings previously formed in a wafer substrate. Interconnect wiring has also been previously formed in the wafer substrate. The chips are bonded to the wafer with conductive solder then cooled from the back side through the openings in the wafer. The disclosed formation process suffers from several problems.

First, chip interconnections are only provided through spun-on gold bridges to solder pads on the wafer and chips. Such bridges are not compatible with high density wiring used for precision aligned macros. Second, the solder used to bond the chips to the wafer may be melted by typical wafer-level wiring, releasing the chips from their positions. Third, multiple through holes in the wafer for chip placement and cooling may cause the wafer to be too fragile for wafer-level wiring processes, such as spin apply resist. Fourth, although thermal dissipation and presumably electrostatic discharge protection can be provided through a heat sink bonded to the back faces of the chips, the disclosed technique is not compatible with chips of different thicknesses because the back faces of the chips will not be co-planer when the faces of the chips are coplaner for bridging between the chips and wafer.

Yet another approach to making planer arrays of dissimilar chips (or segments) is disclosed by John W. Sliwa, Jr. in U.S. Pat. No. 5,075,253. This approach uses a liquid surface-tension driven flotation and assembly mechanism. Sliwa suggests the use of an alignment plate to force the top surfaces of the segments to be co-planer. Sliwa does not disclose or suggest, however, reducing damage caused by electrostatic discharge or thermal dissipation. Nor does Sliwa provide a process for maintaining co-planarity of the tops of chips with different thicknesses.

The importance of overcoming the susceptibility to electrostatic discharge damage is evidenced by the extensive technological development directed to the subject. Steven Howard Voltman et al. teaches a technique, in U.S. Pat. No. 5,930,098, for electrostatic discharge suppression on a chip stack by connecting power plane to power plane and external connect to external connect with conductive busses on the chip edges. This technique is not compatible, however, with planer arrays.

The deficiencies of the conventional devices and fabrication processes show that a need still exists for an improved structure and process for multi-chip chip attach with reduced risk of electrostatic discharge damage and thermal damage. To overcome the shortcomings of the conventional devices and fabrication processes, a new device and fabrication process are provided. An object of the present invention is to provide a precision aligned macro with reduced susceptibility to electrostatic discharge and thermal damage. It is a further object of the present invention to provide a precision aligned macro with improved co-planarity of the faces of the different diced chips. It is yet another object of the present invention to provide a process for fabricating a precision aligned macro according to the previous objects which is compatible with high-density wiring using conventional wafer-level wiring processes.

SUMMARY OF THE INVENTION

To achieve these and other objects, and in view of its purposes, the present invention provides a structure and process for fabricating precision aligned macros (PAMs) with reduced risk of electrostatic discharge damage and thermal damage. The structure and process of the present invention further provide thermal dissipation. An electrical and thermal contact is provided through the back of the individual chips to a supporting silicon substrate.

The process of the present invention includes at least the following steps. A seed layer for electroplating is formed on a support substrate. A thermid layer is formed on the seed layer. Vias are formed in the thermid layer and metal contacts are formed in the vias. The front faces of two or more chips are bonded onto the top surface of an alignment substrate, in which the chips are aligned to the alignment substrate. The back faces of the chips are bonded to the metal contacts and thermid layer with heat and pressure. The alignment substrate is removed. The front faces of the chips are planarized. Interconnect wiring is formed over the chips and thermid layer.

The present invention provides considerable improvement over the prior art. An electrically and thermally conductive path is provided to dissipate electrostatic charge and heat build-up through the back faces of the chips. Also, the present invention provides a co-planer surface at the front faces of the chips and the top of the thermid layer, suitable for forming high-density interconnects using conventional photolithography processes. Photolithography is a process in which a light source illuminates a circuit pattern and projects the image through a lens assembly onto a semiconductor wafer or substrate. Ultimately, the circuit pattern is etched into the wafer.

It should be understood that both the foregoing general description and the following detailed description are exemplary, but are not restrictive, of the present invention.

BRIEF DESCRIPTION OF THE DRAWING

The features and advantages of a semiconductor device according to the present invention and further details of a process of fabricating such a semiconductor device in accordance with the present invention will be more clearly understood from the following description taken in conjunction with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The present invention will be described in detail with reference to the accompanying figures in which like reference numbers designate similar or corresponding elements, regions, and portions. In the present invention, each chip in a precision aligned macro is bonded to a thermid layer having metal contacts on a support substrate using heat and pressure. The thermid layer flows under heat and pressure filling the gaps and maintaining co-planarity of the front faces of the chips. The metal contacts provide an electrically and thermally conductive path dissipating the build-up of electrostatic charge and heat, reducing the risk of electrostatic discharge and thermal damage.

A chip is by definition a semiconductor body in which an integrated circuit is formed or is to be formed. As used in this document, the word "chip" refers to any integrated circuit or segment of an integrated circuit, most particularly segments diced from a wafer after undergoing processing to form devices, interconnects on devices, or both. The front face of a chip is the face on which devices or interconnects are formed. The back face of a chip is opposite the front face.

Figure 1:
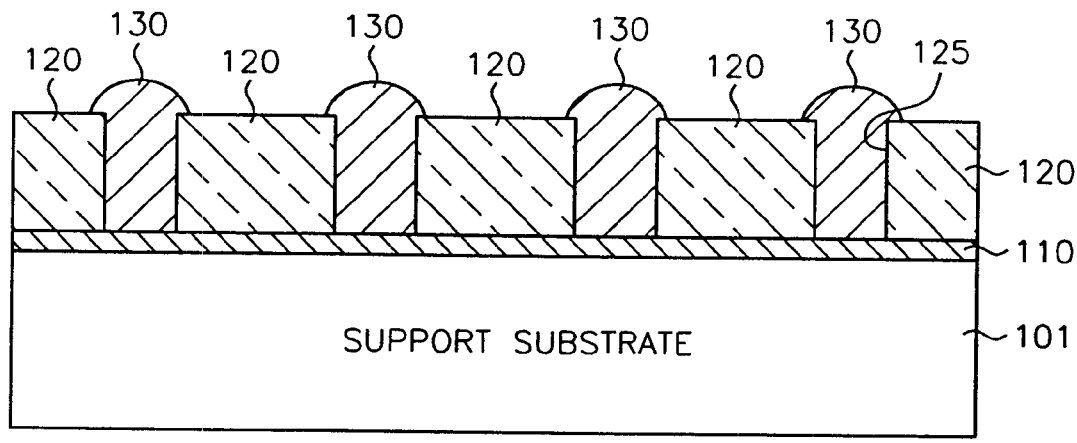
FIG. 1 is a sectional view of a support substrate for a precision aligned macro with a thermid layer having metal-filled vias bonded onto the support substrate according to the present invention.

Referring now to FIG. 1, a support substrate 101 is provided. Multiple chips will be bonded to the support substrate 101. The support substrate 101 should be understood to possibly include a wafer of semiconducting material such as monocrystalline silicon, or any similar structure now known or later developed, such as a silicon-on-insulator structure.

A seed layer 110 is formed on the support substrate 101. The seed layer 110 preferably comprises a metal having good thermal and electrical conductivity which can serve as a seed layer for subsequently formed electroplated contacts. The seed layer 110 can comprise, for example, a stack of an electroless deposited tin/lead (Sn/Pb) or bismuth/tin (Bi/Sn) film over a film comprising one or more of titanium (Ti), tungsten (W), copper (Cu), and CrCu, and preferably all of them for optimum adhesion. The seed layer 110 preferably has a thickness of between about 80 angstroms and 120 angstroms for each layer. More generally, seed layer 110 may be a conductive film, a metallic film, or any film suitable as a layer receiving electroless deposition, electroplating, or sputter deposition.

A thermid layer 120 is formed over the seed layer 110. The thermid layer 120 is preferably spin-applied to a thickness of between about 80,000 and 120,000 angstroms. The thermid layer 120 is preferably soft-baked using a three-step process to remove solvents. The first step is a bake at about 90° C. for about 10 minutes. The second step is a bake at about 130° C. for about 10 minutes. The third step is a bake at about 240° C. for 30 minutes. Thermid can be obtained from Ablestik Labs, Rancho Dominguez, Calif. The properties of thermid that make it especially desirable for this application are: (1) it flows before it thermally "sets" and becomes rigid, and (2) it is a dielectric material with suitable etch properties. More generally, thermid layer 120 may be a dielectric capable of bonding to other surfaces.

The thermid layer 120 is patterned to form vias 125 extending to the underlying seed layer 110. The thermid layer 120 can be patterned using any process now known or later developed. For example, an oxide hard mask can be formed on the thermid layer 120, and a photoresist mask having openings corresponding to the desired vias 125 can be formed over the oxide hard mask. The hard mask can be etched through the openings in the photoresist mask using a plasma etch such as fluorine, and the thermid can be etched through the openings in the oxide hard mask using a reactive ion etch. The oxide hard mask can be stripped after via formation using either a flourine plasma or wet etch with dilute HF. The vias 125 preferably have a diameter of between about 400 microns and 600 microns.

Contacts 130 are formed in the vias 125 in the thermid layer 120 to form a support substrate assembly 100. The contacts 130 preferably comprise a metal such as Sn/Pb mixtures with compositions ranging from 0 to 60% Pb, and with an optimum of 50%, or Bi/Sn mixtures with compositions ranging from 0 to 95% Bi, with optimum values of 0% Bi or 90% Bi. The contacts 130 are preferably electroplated onto the seed layer 110, although the contacts 130 may be deposited onto the seed layer 110 by a variety of other mechanisms, including electroless plating and metalizing. The metal contacts 130 are preferably formed to a level above the top surface of the adjacent thermid layer 120.

Figure 2:
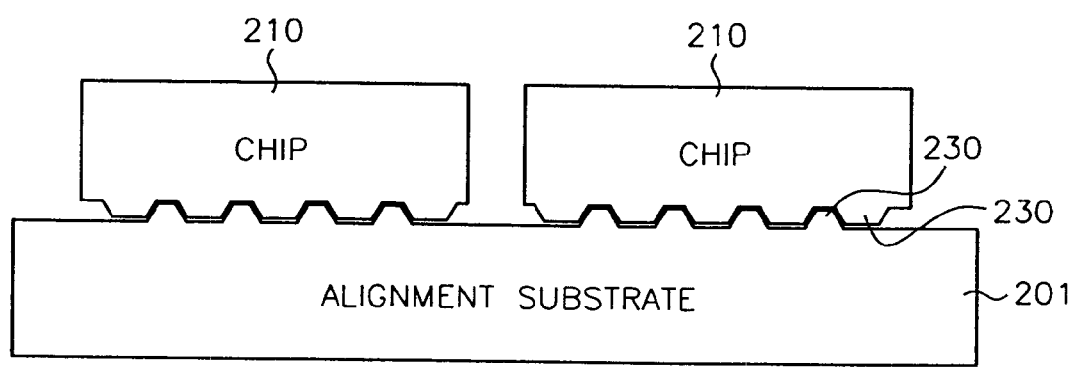
FIG. 2 is a sectional view of diced chips bonded to an alignment substrate in which the chips are aligned to the alignment substrate by interlocking protrusions on the diced chips and the alignment substrate.

Referring now to FIG. 2, two or more chips 210 are bonded to an alignment substrate 201 to form an alignment substrate-chip assembly 200. In one embodiment of the present invention, the chips 210 are aligned to the alignment substrate 201 using interlocking protrusions 230 on the front faces of the chips 210 and on the top surface of the alignment substrate 201. The chips 210 are preferably bonded to the alignment substrate 201 with a thermally decomposable epoxy. The interlocking protrusions 230 preferably comprise polyimide. The process of aligning chips to an alignment substrate with interlocking protrusions is described in U.S. patent application Ser. No. 09/657,232, filed on Sep. 7, 2000, which is incorporated in this document by reference.

Optionally, the adhesive used to bond the chips 210 to the alignment substrate 201 or the interlocking protrusions 230 can be conductive to dissipate electrostatic charges. For example, the adhesive could comprise polyaniline or another industrial conductive polymer. Alternatively, the interlocking protrusions 230 could comprise impurity-doped polyimide to render them conductive.

Figure 3:
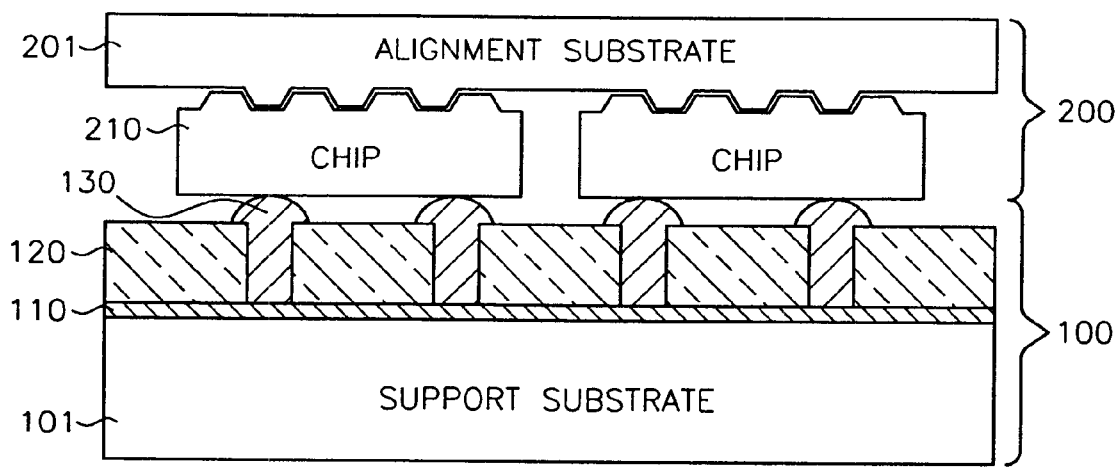
FIG. 3 shows a sectional view of a process for attaching the support substrate of FIG. 1 to the back faces of the diced chips of FIG. 2 according to the present invention prior to application of heat and pressure.

Referring now to FIG. 3, the alignment substrate-chip assembly 200 is inverted and pressed onto the support substrate assembly 100 while heat is applied to bond the back faces of the chips 210 to the thermid layer 120 and the contacts 130. When exposed to the combination of heat and pressure, the thermid layer 120 flows and bonds to the back faces and sides of the chips 210. The heat and pressure also causes the contacts 130 to become malleable and bond to the back faces of the chips 210. The back faces of the chips 210 are preferably bonded to the thermid layer 120 and the contacts 130 using an anneal at a temperature of about 250° C. for about 30 minutes at atmospheric pressure.

Figure 4:
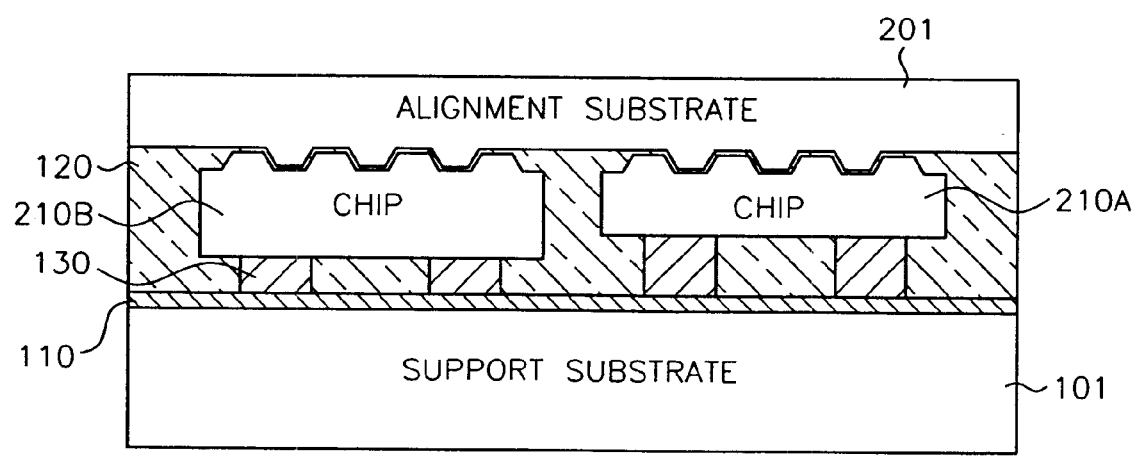
FIG. 4 shows a sectional view of a process for attaching the support substrate of FIG. 1 to the back faces of the diced chips of FIG. 2 according to the present invention subsequent to application of heat and pressure.

As shown in FIG. 4, bonding the back faces of the chips 210 to the thermid layer 120 and the contacts 130 forms a support substrate-chip-alignment substrate stack. The flow of the thermid layer 120 fills the gaps between adjacent chips 210. The flow of the thermid layer 120 also reduces the height of the support substrate-chip-alignment substrate stack.

FIG. 4 also shows an optional embodiment of the present invention in which one chip 210A is thinner than an adjacent chip 210B. Because the front face of each chip is held co-planer to the other by the alignment substrate 201, the difference in the thicknesses of the chips is accommodated by the flow of the thermid layer 120 and the deformation of the contacts 130. The front face of the thicker chip 210B will remain co-planer with the front face of the thinner chip 210A by displacing a greater volume of the thermid layer 120 beneath the thicker chip 210B.

Figure 5:
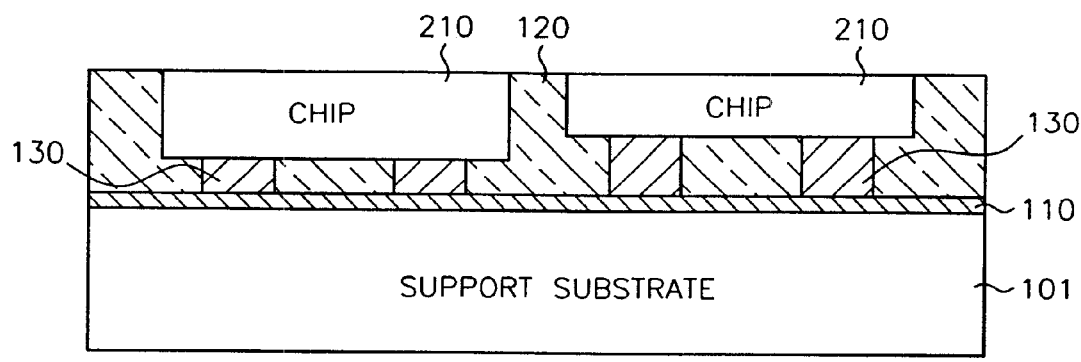
FIG. 5 is a sectional view of a precision aligned macro prior to interconnect wiring with the alignment substrate and the interlocking protrusions removed from the faces of the diced chips.

Referring now to FIG. 5, after bonding the chips 210 to the thermid layer 120 and the contacts 130, the alignment substrate 201 is removed. Because the chips 210 were preferably bonded to the alignment substrate 201 with a thermally decomposable epoxy, the epoxy will have degraded during the process of bonding the chips 210 to the thermid layer 120 and the contacts 130. This degradation should allow the alignment substrate 201 to be lifted off the support substrate-chip-alignment substrate stack.

After the alignment substrate 201 is removed, the polyimide interlocking protrusions 230 and any excess thermid are removed from the front face of the chips 210. One process for removing the polyimide interlocking protrusions 230 and excess thermid is an ashing process. The chips 210 can then be planarized, at least to a substantial degree, using a chemical-mechanical polishing process.

Figure 6:
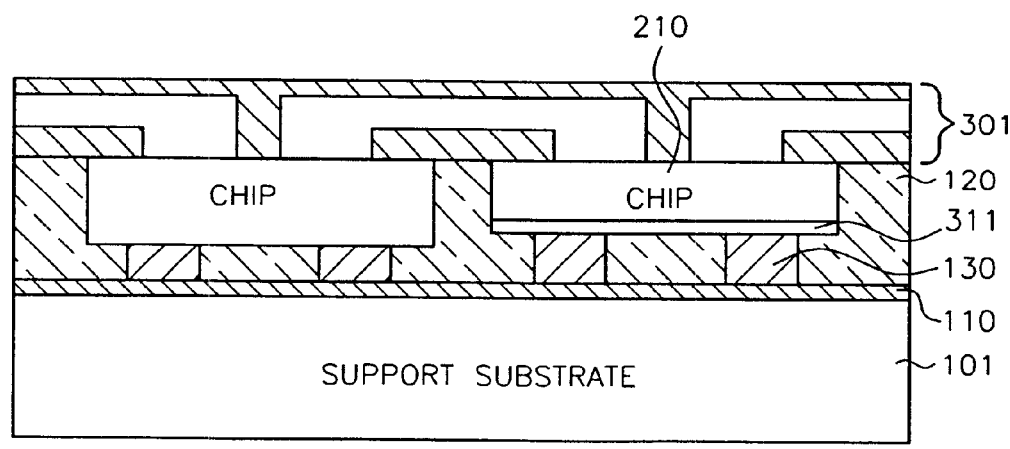
FIG. 6 is a sectional view of a precision aligned macro according to the present invention with high density interconnect wiring, the view showing an optional oxide layer on the back face of one diced chip to provide a different grounding level.

Referring now to FIG. 6, high-density interconnect wiring 301 is formed over the faces of the chips 210 to complete the precision aligned macro. Because the faces of the chips 210 and the thermid layer 120 are co-planer, the high-density interconnect wiring 301 can be formed over the chips and thermid using conventional lithographic processes.

In an optional embodiment of the present invention, one or more of the chips 210 in the precision aligned macro are grounded at a higher voltage than other chips. An oxide layer 311 is formed on the back face of one or more of the chips 210. The oxide layer 311 increases the reference voltage for electrostatic discharge through the contacts 130. The oxide layer 311 is thin enough (less than 100 angstroms) to allow thermal dissipation through the contacts 130 while increasing the voltage at which electrostatic build-up is discharged through the contacts 130.

Figure 7:
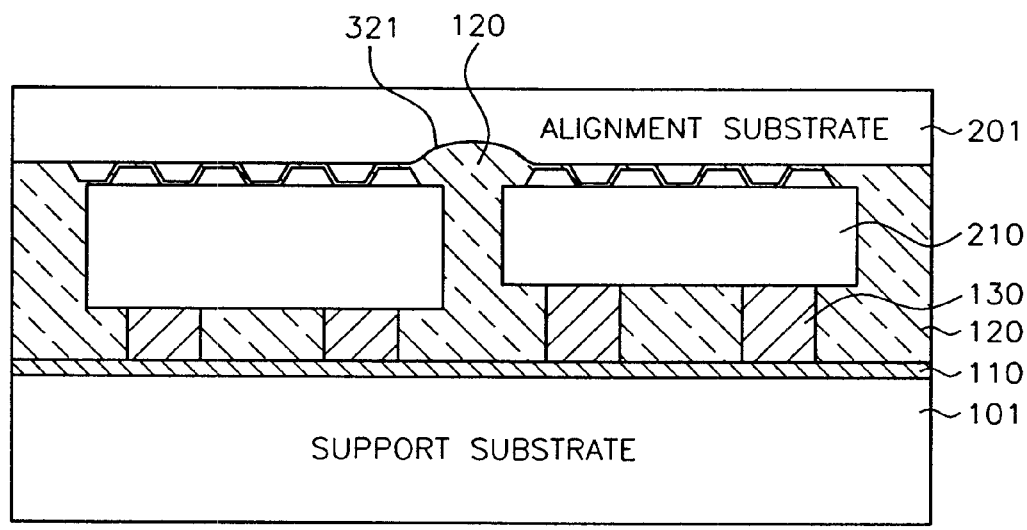
FIG. 7 is a sectional view of a precision aligned macro according to the present invention during thermid and contact to chip bonding, the view showing an alternate embodiment to compensate for thermid shrinkage.

FIG. 7 shows an optional embodiment of the present invention, in which a recess 321 is formed in the alignment substrate 201. The recess 321 allows overflow of thermid 120 during the application of heat and pressure in the bonding process. When the thermid 120 cools, it hardens and shrinks. The overflow of thermid prevents the thermid from shrinking below the adjacent chips 210 at the gap between chips 210.

Although illustrated and described above with reference to certain specific embodiments, the present invention is nevertheless not intended to be limited to the details shown. Rather, various modifications may be made in the details within the scope and range of equivalents of the claims and without departing from the spirit of the invention. For example, although the foregoing description addresses joining diced chips into a flat array for a precision aligned macro, embodiments joining other types of chips into other flat arrays would be within the scope of the present invention.

What is claimed:

1. A process for fabricating precision aligned macros, comprising the steps of:
   (a) providing a support substrate with a first layer on the support substrate;
   (b) forming a dielectric layer on the first layer;
   (c) creating vias in the dielectric layer and contacts in the vias;
   (d) bonding the front faces of two or more chips onto the top surface of an alignment substrate, with the chips aligned to the alignment substrate;
   (e) bonding the back faces of the chips to the contacts and dielectric layer;
   (f) removing the alignment substrate;
   (g) planarizing to a substantial degree the front faces of the chips; and
   (h) forming interconnect wiring between the chips.

2. The process of claim 1 wherein the chips are aligned to the alignment substrate by interlocking polyimide protrusions on the front faces of the chips and on the top surface of the alignment substrate.

3. The process of claim 1 wherein the contacts are formed extending to a level above the top surface of the adjacent dielectric layer.

4. The process of claim 1 wherein the contacts comprise metal electroplated onto the first layer through the vias.

5. The process of claim 1 wherein the chips have different thicknesses and the front faces of the chips are co-planer with each other and the top surface of the dielectric layer after bonding with the dielectric layer and contacts due to flow of the dielectric layer and deformation of the contacts.

6. The process of claim 1 wherein an oxide layer is formed on the back face of at least one of the chips to change the voltage at which electrostatic charge is dissipated from that chip through the contacts.

7. The process of claim 1 wherein a recess is formed in the alignment substrate to allow dielectric overflow to compensate for shrinkage of the dielectric during bonding.

8. The process of claim 1 wherein the chips are bonded to the alignment substrate with an electrically conductive adhesive.

9. The process of claim 2 wherein the interlocking protrusions are electrically conductive.

10. A process for fabricating precision aligned macros, comprising the steps of:
- (a) providing a support substrate with a conductive layer on the support substrate;
- (b) forming a dielectric layer on the conductive layer;
- (c) creating vias in the dielectric layer;
- (d) forming metal contacts on the conductive layer through the vias, the contacts formed to extend to a level above the top surface of the adjacent dielectric layer;
- (e) bonding the front faces of two or more chips onto the top surface of an alignment substrate, with the chips aligned to the alignment substrate, the alignment substrate having a recess to allow dielectric overflow to compensate for shrinkage of the dielectric during bonding;
- (f) bonding the back faces of the chips to the metal contacts and dielectric layer;
- (g) removing the alignment substrate;
- (h) planarizing to a substantial degree the front faces of the chips; and
- (i) forming interconnect wiring between the chips.

11. The process of claim 10 wherein the chips are aligned to the alignment substrate by interlocking polyimide protrusions on the front faces of the chips and on the top surface of the alignment substrate.

12. The process of claim 11 wherein the interlocking protrusions are electrically conductive.

13. The process of claim 10 wherein the chips have different thicknesses and the front faces of the chips are substantially co-planer with each other and the top surface of the dielectric layer after bonding with the dielectric layer and contacts due to flow of the dielectric layer and deformation of the contacts.

14. The process of claim 10 wherein an oxide layer is formed on the back face of at least one of the chips to change the voltage at which electrostatic charge is dissipated from that chip through the contacts.

15. The process of claim 10 wherein the chips are bonded to the alignment substrate with an electrically conductive adhesive.

* * * * *